United States Patent [19]
Risch et al.

[11] Patent Number: 5,559,353
[45] Date of Patent: Sep. 24, 1996

[54] INTEGRATED CIRCUIT STRUCTURE HAVING AT LEAST ONE CMOS-NAND GATE AND METHOD FOR THE MANUFACTURE THEREOF

[75] Inventors: Lothar Risch, Neubiberg; Thomas Vogelsang; Franz Hofmann, both of Munich; Karl Hofmann, Wennigsen, all of Germany

[73] Assignee: Siemens Aktiengesellschaft, Munich, Germany

[21] Appl. No.: 332,737

[22] Filed: Nov. 1, 1994

[30] Foreign Application Priority Data

Dec. 7, 1993 [DE] Germany ............. 43 41 667.5

[51] Int. Cl.[6] .................. H01L 27/092; H01L 29/78
[52] U.S. Cl. ................. 257/334; 257/331; 257/337; 257/369; 326/106
[58] Field of Search .................. 257/331, 334, 257/337, 369; 326/106

[56] References Cited

U.S. PATENT DOCUMENTS

| | | | |
|---|---|---|---|
| 4,554,570 | 11/1985 | Jastrzebski et al. | |
| 4,566,025 | 1/1986 | Jastrzebski et al. | 257/331 |
| 4,788,158 | 11/1988 | Chatterjee | |
| 4,810,906 | 3/1989 | Shah et al. | 257/334 |
| 5,138,197 | 8/1992 | Kuwana | 326/106 |
| 5,311,050 | 5/1994 | Nitayama et al. | 257/369 |

OTHER PUBLICATIONS

"Modular Approach to C–MOS Technology Tailors Process to Application," Kokkonen et al., Electronics, May 3, 1994, pp. 129–133.

"Complex 3D CMOS Circuits Based on a Triple-Decker Cell," Roos et al., IEEE J. of Solid–State Cir., vol. 27, No. 7, Jul. 1992, pp. 1067–1072.

"Einsatz von Deltadotierschichten für die Silizium–Nanoelektronik," Kiunke, 1992, pp. 2–3.

*Primary Examiner*—Jerome Jackson
*Attorney, Agent, or Firm*—Hill, Steadman & Simpson

[57] ABSTRACT

A first MOS transistor and a second MOS transistor are connected in series with a first complementary MOS transistor and a second complementary MOS transistor that are connected in parallel with one another. The transistors are each realized as a vertical layer sequence that forms the source, channel and drain and that which has a sidewall at which a gate dielectric and a gate electrode are arranged. The complementary MOS transistors connected in parallel with one another are realized in a common layer sequence of the source, channel and drain. The layer sequences that form the series-connected transistors are arranged above one another. The circuit structure is manufactured by epitaxal definition of the layer sequences, such as by molecular beam epitaxy.

5 Claims, 6 Drawing Sheets

INTEGRATED CIRCUIT STRUCTURE HAVING AT LEAST ONE CMOS-NAND GATE AND METHOD FOR THE MANUFACTURE THEREOF

BACKGROUND OF THE INVENTION

1. Field of the Invention

The present invention relates to an integrated circuit structure of the type having at least one CMOS NAND gate, as well as to a method for manufacturing such a circuit structure.

2. Description of the Prior Art

In planar silicon technology, the source, channel and drain of a MOS transistor are laterally arranged. A gate dielectric and a gate electrode are arranged at the surface of the channel region. The obtainable gate lengths of these MOS transistors as well as the obtainable packing density of integrated circuits composed of a plurality of MOS transistors are dependent on the resolution of the lithography employed and on tolerances in the structuring and adjustment. Typical gate lengths of 0.6 µm are achieved in the 16M generation and typical gate lengths of 0.35 µm are achieved in the 64M generation.

A further reduction of the lateral expanse is sought by improvements in the optical lithography as well as in the lacquer and etching technique. It seems questionable, however, whether transistors having channel lengths below 100 nm can be reproducibly manufactured in this way because of the limited resolution of the optical lithography and because of the increasing problems with tolerances in the structuring and adjustment.

Smaller structural sizes in planar technology can be achieved by employing electron beam lithography instead of optical lithography. Manufacturing individual, functional MOS transistors with channel lengths down to 50 nm has been achieved with an electron beam printer on a laboratory scale. Due to its low processing speed, however, electron beam lithography seems unsuitable for use in commercial scale semiconductor fabrication for economical reasons.

The problem of increased packing density particularly arises given complex logic circuits such as logic gates, since a plurality of n-channel and p-channel transistors must be insulated from one another, but must also be selectively electrically connected to one another in such circuits.

An overview of possible uses of molecular beam epitaxy is provided in the introduction to the dissertation of W. Kiunke, 1992, pp. 2–3. Uniform layers having a minimal thickness of around 1 atom layer can be produced in controlled fashion in molecular beam epitaxy. A doping of the layers in the range from $10^{14}$ cm$^{-3}$ through $10^{20}$ cm$^{-3}$ is possible in situ during the epitaxy by adding dopant. As an applied example, a proposal for a vertical CMOS invertor is discussed. The proposed invertor is realized as a mesa structure on a substrate. The mesa structure comprises an npnpnp layer sequence with vertical sidewalls. All vertical sidewalls of the layers are provided with a gate dielectric and with a gate electrode at one side.

SUMMARY OF THE INVENTION

An object of the present invention is to provide an integrated circuit structure having at least one CMOS-NAND gate wherein an increased packing density is achieved. In particular, the NAND gate should comprise MOS transistors having a defined channel length in the range down to less than 50 nm. Another object of the invention is to specify a manufacturing method for such an integrated circuit structure.

The above objects are achieved in an integrated circuit structure, and a method for manufacturing the integrated circuit structure, wherein a first MOS transistor and a second MOS transistor are connected in series with a first complementary MOS transistor and a second complementary MOS transistor, the complementary transistors being connected in parallel with each other, each of the transistors being formed by a vertical layer sequence forming, for that transistor, a source, channel and drain and each transistor layer sequence also having a sidewall at which a gate dielectric and a gate electrode are disposed, the first and second complementary MOS transistors which are connected in parallel sharing a common layer sequence forming the source, channel and drain for both of those transistors, and the respective layer sequences which form the series-connected first and second transistors, and the common layer sequence, being disposed above one another.

In the circuit structure of the invention, the CMOS-NAND gate is formed by a first MOS transistor and a second MOS transistor that are connected in series with a first, complementary MOS transistor and a second, complementary MOS transistor that are in turn connected in parallel with one another. The MOS transistors and the complementary MOS transistors are each realized as a vertical layer sequence. The vertical layer sequence has layers corresponding to the source, channel and drain. The vertical layer sequence has a sidewall that cuts the layers and at which a gate dielectric and a gate electrode are arranged. The complementary MOS transistors connected in parallel are thereby realized in a common layer sequence of the source, channel and drain. The layer sequences that form the series-connected transistors are arranged above (overlying) one another. Those layers that form source or drain regions have a thickness between 50 nm and 700 nm, preferably between 100 nm and 400 nm; those that form a channel have a thickness between 10 nm and 200 nm, preferably between 50 nm and 100 nm.

In the integrated circuit structure of the invention, the lateral expanse of the CMOS-NAND gate is defined by the number and arrangement of the required terminals for the MOS transistors and for the complementary MOS transistors. High packing densities are achieved in the integrated circuit structure on the basis of a suitable arrangement of the layers, combination of layers as well as combination of terminals.

The channel length of the transistors is defined by the layer thickness in which the layer acting as channel is respectively produced. The layer sequence is preferably produced by epitaxy. Layer thicknesses of less than 10 nm can be produced in controlled fashion with the assistance of molecular beam epitaxy or with RTP-CVD (rapid thermal processing-chemical vapor deposition).

The integrated circuit structure of the invention is preferably realized on the basis of a substrate that comprises silicon at least in the region of the surface on which the layer sequence is produced. In this case, the circuit structure of the invention can be integrated with other circuit elements realized in conventional silicon technology. To that end, the substrate can be both a substrate of monocrystalline silicon as well as a SOI substrate.

In order to avoid overlap capacitances, the layer sequence forming the CMOS-NAND gate can be surrounded with an insulating layer.

DESCRIPTION OF THE PREFERRED EMBODIMENTS

Figure 1:
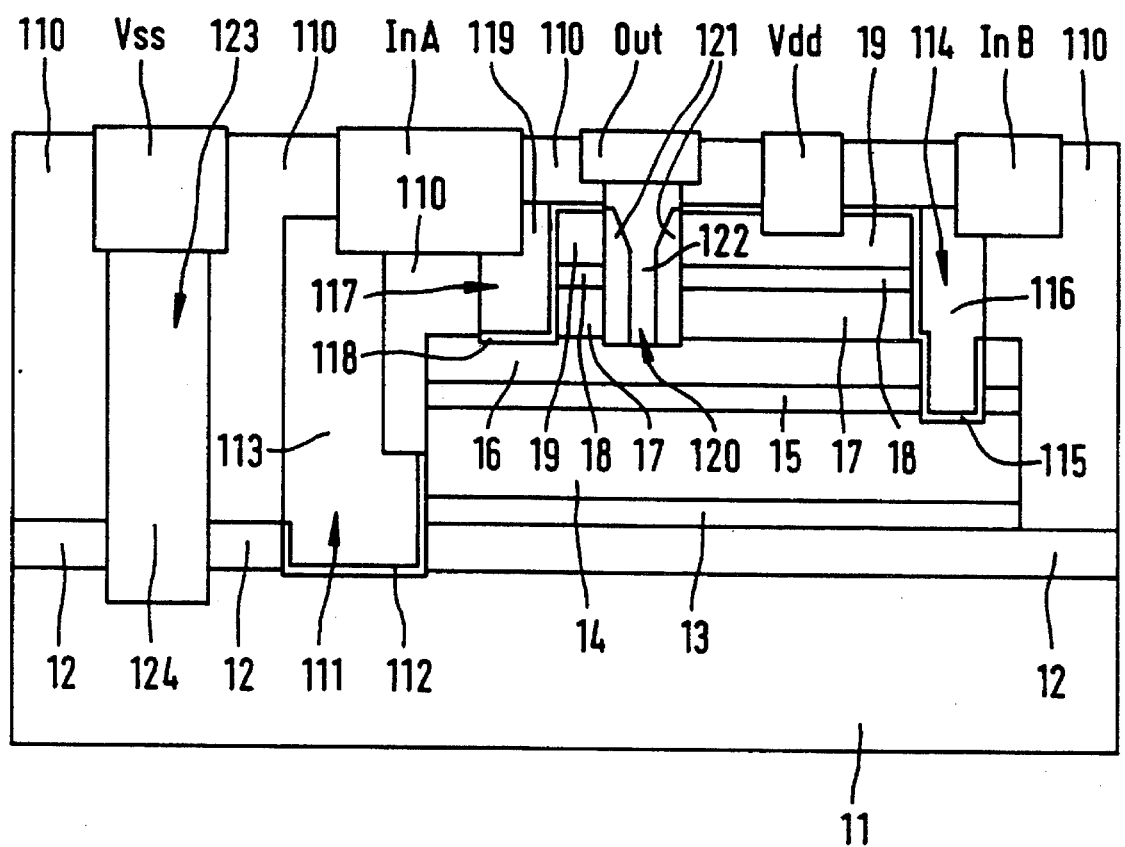
FIG. 1 is a section through a CMOS-NAND gate of the invention.

A first layer 12 of $n^+$-doped silicon is arranged surface-wide on the surface of a substrate 11 of, for example, p-doped, monocrystalline silicon (see FIG. 1). The first layer 12 has a thickness of, for example, 200 nm and has a dopant concentration of $10^{20}$ cm$^{-3}$. A second layer 13 that is composed of p-doped, monocrystalline silicon and that has a thickness of, for example, 100 nm and a dopant concentration of, for example $10^{18}$ cm$^{-3}$ is arranged on the surface of the first layer 12.

A third layer 14 that is composed of $n^+$-doped silicon that has a thickness of 700 nm and a dopant concentration of $10^{20}$ cm$^{-3}$ is arranged on the surface of the second layer 13.

A fourth layer 15 that is composed of p-doped, monocrystalline silicon and has a thickness of 100 nm and a dopant concentration of $10^{18}$ cm$^{-3}$ is arranged on the surface of the third layer.

A fifth layer 16 is arranged on the surface of the fourth layer 15. The fifth layer 16 is composed of $n^+$-doped, monocrystalline silicon and has a thickness of 200 nm and a dopant concentration of $10^{20}$ cm$^{-3}$.

A sixth layer 17 that is composed of $p^+$-doped, monocrystalline silicon and has a thickness of 200 nm and a dopant concentration of $10^{20}$ cm$^{-3}$ is arranged on the surface of the fifth layer 16.

A seventh layer 18 that is composed of n-doped, single-crystal silicon and that has a layer thickness of 100 nm and a dopant concentration of $10^{18}$ cm$^{-3}$ is arranged on the surface of the sixth layer 17.

An eighth layer 19 that is composed of $p^+$-doped, monocrystalline and has a thickness of 200 nm and a dopant concentration of $10^{20}$ cm$^{-3}$ is arranged on the surface of the seventh layer 18.

The second layer 13, the third layer 14, the fourth layer 15, the fifth layer 16, the sixth layer 17, the seventh layer 18 and the eighth layer 19 are completely surrounded by an insulating layer 110 of, for example SiO$_2$. Only the first layer 12 also extends under the insulating layer 110. The first layer 12 can thereby be fashioned as a continuous layer or as a well.

A first opening 111 is provided that is arranged at the edge of the layer structure and that extends from the surface of the layer structure down to the surface of the substrate 11. The surface of the first opening 111 adjoining the respective surfaces of the first layer 12, the second layer 13 and the third layer 14 is provided with a first gate dielectric 112. The first opening 111 is filled with a conductive structure 113 that is insulated from the third layer 14, from the fourth layer 15 and from the fifth layer 16 by a part of the insulating layer 110. The first conductive structure 113 is composed, for example, of $n^+$-doped polysilicon.

A second opening 114 that extends from the surface of the eighth layer 19 at least down onto the surface of the third layer 14 is provided in the layer sequence. The surface of the second opening 114 that adjoins the third layer 14, the fourth layer 15, the fifth layer 16, the sixth layer 17, the seventh layer 18 and the eighth layer 19 is provided with a second gate dielectric 115. The second opening 114 is filled with a second conductive structure 116 of, for example, $n^+$-doped polysilicon. The second gate dielectric 118 acts as insulation structure between the second conductive structure 116 and the third layer 14, the fifth layer 16, the sixth layer 17 and the eighth layer 19. The second conductive structure 116 is insulated from the remaining layers and from the substrate 11.

A third opening 117 that extends down into the surface of the fifth layer 16 is provided in the layer sequence. The surface of the third opening 117 that adjoins the fifth layer 16, the sixth layer 17, the seventh layer 18 and the eighth layer 19 is covered with a third gate dielectric 118. The third opening 117 is filled with a third conductive structure 19 of $n^+$-doped polysilicon. The third gate dielectric 118 acts as an insulation structure between the third conductive structure 119 and the fifth layer 16, sixth layer 17 as well as the eighth layer 19.

A fourth opening 120 that extends onto the surface of the fifth layer 16 is provided in the layer sequence. The sidewalls of the fourth opening 120 are provided with insulating spacers 121. The insulating spacers 121 completely cover the surface of the eighth layer 19, of the seventh layer 18 and of the sixth layer 17. The volume remaining within the fourth opening 120 between the insulating spacers 121 is filled with a fourth conductive structure 122 of, for example, $n^+$-doped polysilicon. The fourth conductive structure 122 contacts the fifth layer 16.

A fifth opening 123 is provided to the side of the layer sequence formed of the second layer 13 through the eighth layer 19. The fifth opening 123 extends at least into the first layer 12. The fifth opening 123 is completely surrounded by the insulating layer 110 above the first layer 12. The fifth opening 123 is filled with a fifth conductive structure 124 of $n^+$-doped polysilicon. The first conductive structure 113 and the third conductive structure 119 are provided with a common contact InA. The second conductive structure 116 is provided with a contact InB. The fourth conductive 122 is provided with a contact Out. The fifth conductive structure 124 is provided with a contact Vss for a first supply voltage. The eighth layer 19 is provided with a contact Vdd for a second supply voltage. The contacts are formed, for example, of aluminum.

Figure 2:
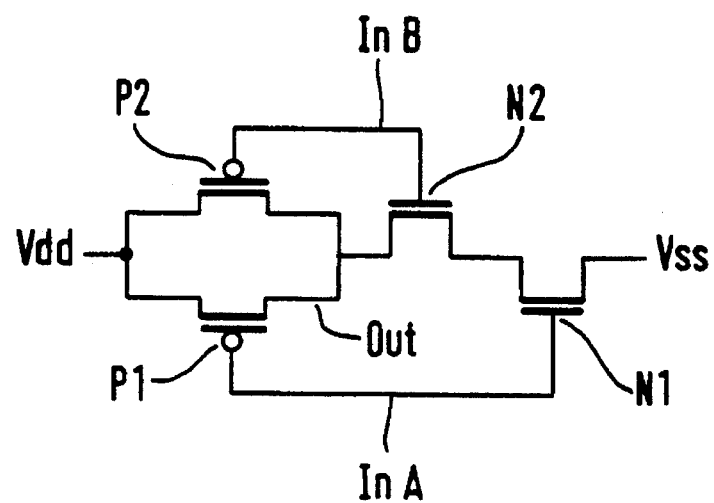
FIG. 2 is a circuit diagram of the CMOS-NAND gate of FIG. 1.

The first layer 12, the second layer 13 and the third layer 14 form the source, channel and drain of a first n-channel transistor N 1 for which the first conductive structure 113 forms a gate electrode (see FIG. 2). The third layer 14, the fourth layer 15 and the fifth layer 16 form a second n-channel transistor N2 for which the second conductive structure 116 forms a gate electrode. The sixth layer 17, the seventh layer 18 and the eighth layer 19 form source, channel and drain both for a first p-channel transistor P1, for which the second conductive structure 116 forms a gate electrode. The layers 17, 18 and 19 also form the source, channel and drain for a second p-channel transistor P2, for which the third conductive structure forms a gate electrode and that is connected in parallel with the first p-channel transistor P1. The fifth layer 16 is connected to the sixth layer 17 via a tunnel effect that arises given dopant concentrations of about $10^{20}$ cm$^{-3}$. The contacts InA and InB form the inputs of the CMOS-NAND gate and the contact Out forms the output of the CMOS-NAND gate.

In the practical realization of this CMOS-NAND gate, the insulating layer 110 is usually realized composed of a plurality of insulating layers.

Figure 3:
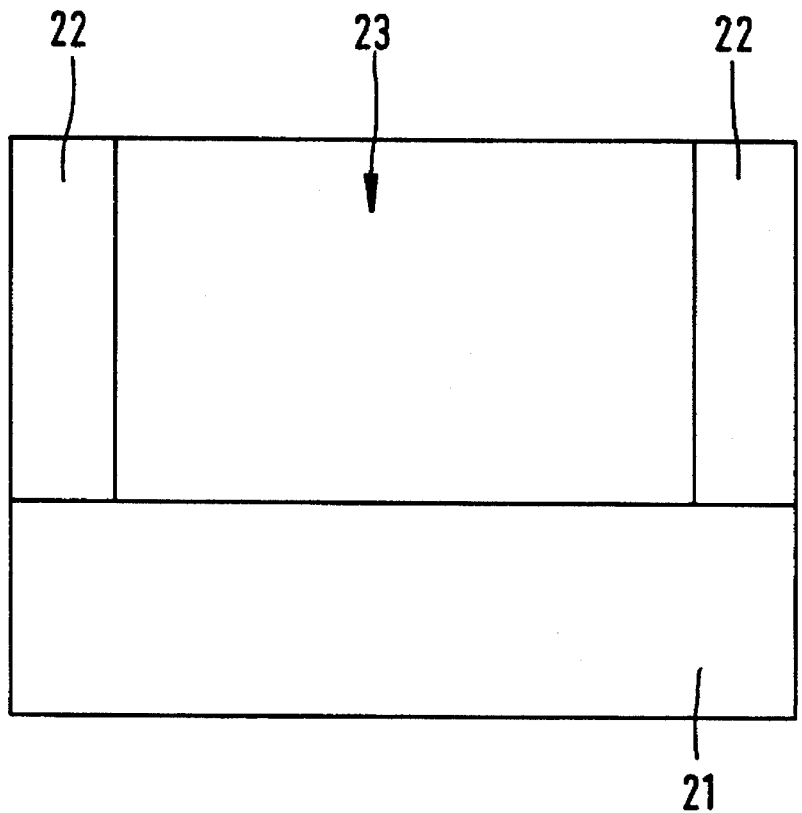
FIGS. 3–11 are sectional views respectively illustrating a sequence of steps for the manufacture of a CMOS-NAND gate that is surrounded by an insulating layer, in accordance with the invention.

For manufacturing a CMOS-NAND gate of the invention, for example, a first insulation layer 22 of, for example, $SiO_2$ is applied onto a substrate 21 of, for example, p-doped, monocrystalline silicon. The first insulation layer 22 is produced, for example, by thermal oxidation or by CVD deposition (see FIG. 3). The first insulation layer 22 is applied in a thickness of, for example, 1.5 μm.

A first hole 23 is etched into the first insulation layer 22. The first hole 23 extends onto the surface of the substrate 21. As seen in a plane, parallel to the surface of the substrate 21, the first hole 23 has an essentially rectangular cross section having edge lengths of 4 μm. The first hole 23 is etched using a first mask.

By epitaxy, a first layer 24 is grown on the uncovered (exposed) surface of the substrate 21, a second layer 25 is grown on the first layer 24, a third layer 26 is grown on the second layer 25, a fourth layer 27 is grown on the third layer 26 and a fifth layer 28 is grown on the fourth layer 27. The epitaxy ensues, for example, with molecular beam epitaxy in the temperature range between 400° and 700° C. and at a pressure of approximately 1 mbar, or by selective epitaxy with RTP-CVD (rapid thermal processing-chemical vapor deposition) with $SiH_2Cl_2$ gas, whereby the layers are respectively provided with a doping in situ. To that end, appropriate dopant is added in the epitaxy.

The first layer 24 is deposited, for example, with a thickness of 200 nm and is $n^+$-doped with a dopant concentration of $10^{20}$ $cm^{-3}$. The second layer 25 is deposited with a thickness of, for example, 100 nm and is p-doped with a dopant concentration of $10^{18}$ is $cm^{-3}$. The third layer 26 is deposited with a thicknesses of, for example, 400 nm and is $n^+$-doped with a dopant concentration of $10^{20}$ $cm^{-3}$. The fourth layer 27 is deposited with a thickness of, for example, 100 nm and is p-doped with a dopant concentration of $10^{18} cm^{-3}$. The fifth layer 28 is deposited with a thickness of, for example, 200 nm and is $n^+$-doped with a dopant concentration of $10^{20}$ $cm^{-3}$.

Figure 4:
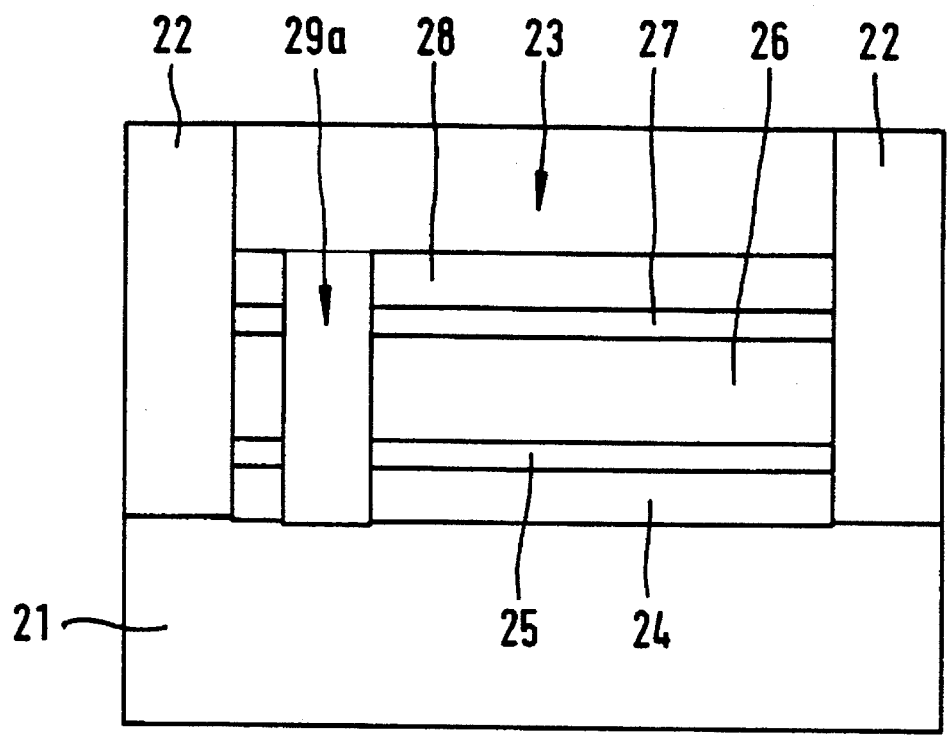

A first part 29a of a first opening 29 is produced, this being adjacent to a sidewall of the first hole 23 and extending onto the surface of the substrate 21 (see FIG. 4). The first part 29a of the first opening 29 cuts through the layer sequence composed of the first layer 24, the second layer 25, the third layer 26, the fourth layer 27 and the fifth layer 28 from one sidewall of the first hole 23 to the opposite sidewall of the first hole 23. The first part of the first opening 29a comprises an expanse of approximately 0.6 μm 4 μm parallel to the surface of the substrate 21.

A first dielectric layer 210 is produced by thermal oxidation in the temperature range between 700° and 800° C. Due to thermal oxidation in this temperature range, $SiO_2$ grows faster by approximately a factor of five on the surface of layers that have a dopant concentration of at least $10^{19}$ $cm^{-3}$ than on the surface of layers having a lower dopant concentration. The oxidation is implemented such that the first dielectric layer 210 has a thickness of 5 nm in the region of the surface of the second layer 25. In this region, the first dielectric layer 210 acts as the gate dielectric. By contrast thereto, the dielectric layer 210 grows with a thickness that is greater by a factor of five on the surface of the first layer 24 as on the surface of the third layer 26 and acts here as an insulation structure.

Figure 5:
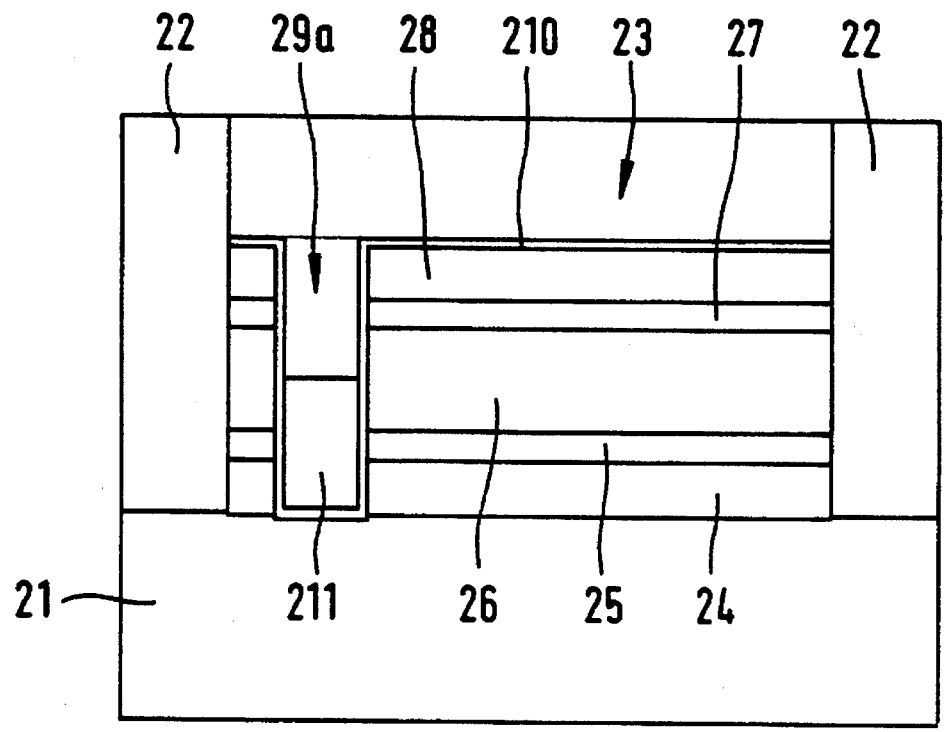

The first part 29a of the first opening 29 is filled, for example, with $n^+$-doped polysilicon 211. By re-etching, the height of the polysilicon 211 is set such that it corresponds approximately to the middle of the second layer 25 (see FIG. 5). The overall etching thickness amounts, for example, to 1.5 through 0.5 μm.

Figure 6:
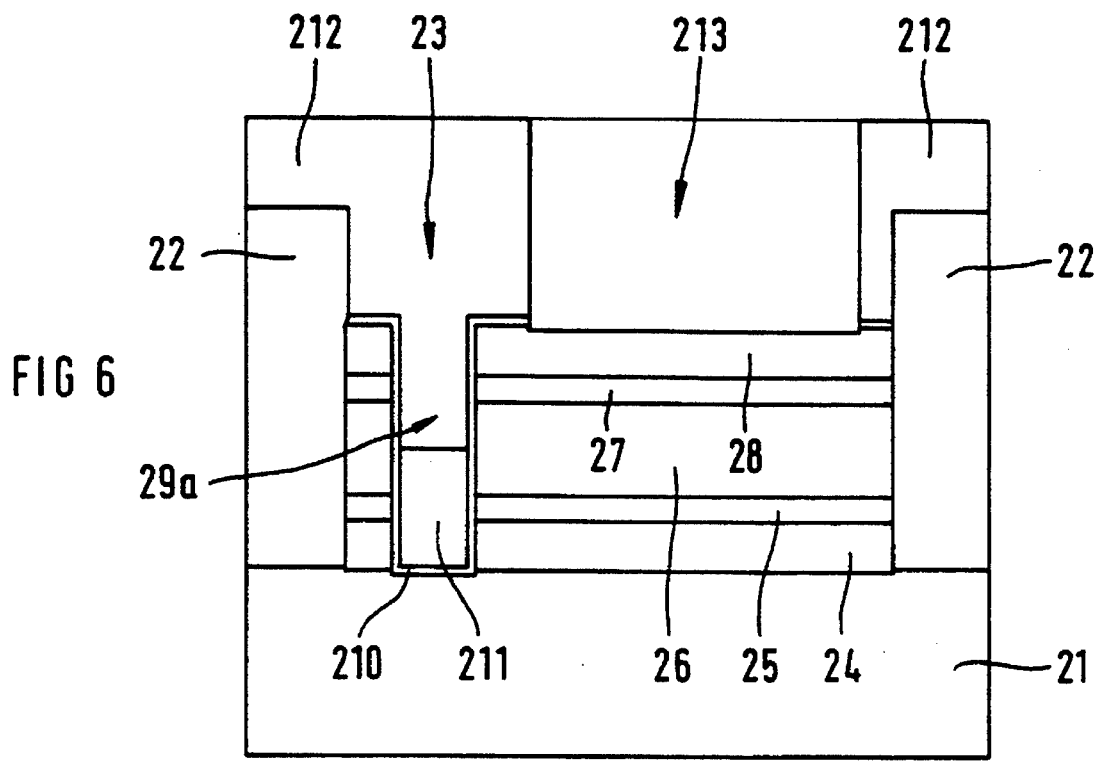

A second insulating layer 212 is deposited surface-wide, which fills up the remaining volume in the first part 29a of the first opening 29 and in the first hole 23. The second insulating layer 212 is formed, for example, of $SiO_2$ and is deposited with a thickness of, for example, 1.4 μm. Using photolithography and an anisotropic etching process, a second hole 213 that extends onto the surface of the fifth layer 28 is produced in the second insulating layer 212. The second hole 213 is produced such that the first part 29a of the first opening 29 remains covered with the second insulating layer 212 (see FIG. 6). In the second hole 213, a sixth layer 214 of silicon is grown on the surface of the fifth layer 28 by epitaxy, a seventh layer 215 is grown on the sixth layer 214 and an eighth layer 216 is grown on the seventh layer 215. The epitaxy ensues, for example, as molecular beam epitaxy in the temperature range between 400° and 700° C. and at a pressure of approximately 1 mbar or as selective RTP-CVD epitaxy with $SiH_2Cl_2$ process gas. The layers are deposited doped in situ by the addition of appropriate dopant. The sixth layer 214 is $p^+$-doped with a dopant concentration of $10^{20}$ $cm^{-3}$. The sixth layer 214 is deposited with a thickness of approximately 200 nm. The seventh layer 215 is deposited with a thickness of approximately 100 nm and is n-doped with a dopant concentration of approximately $10^{18}$ $cm^{-3}$. The eighth layer 216 is deposited with a thickness of approximately 200 nm and is p-doped with a dopant concentration of approximately $10^{20}$ $cm^{-3}$.

Figure 7:
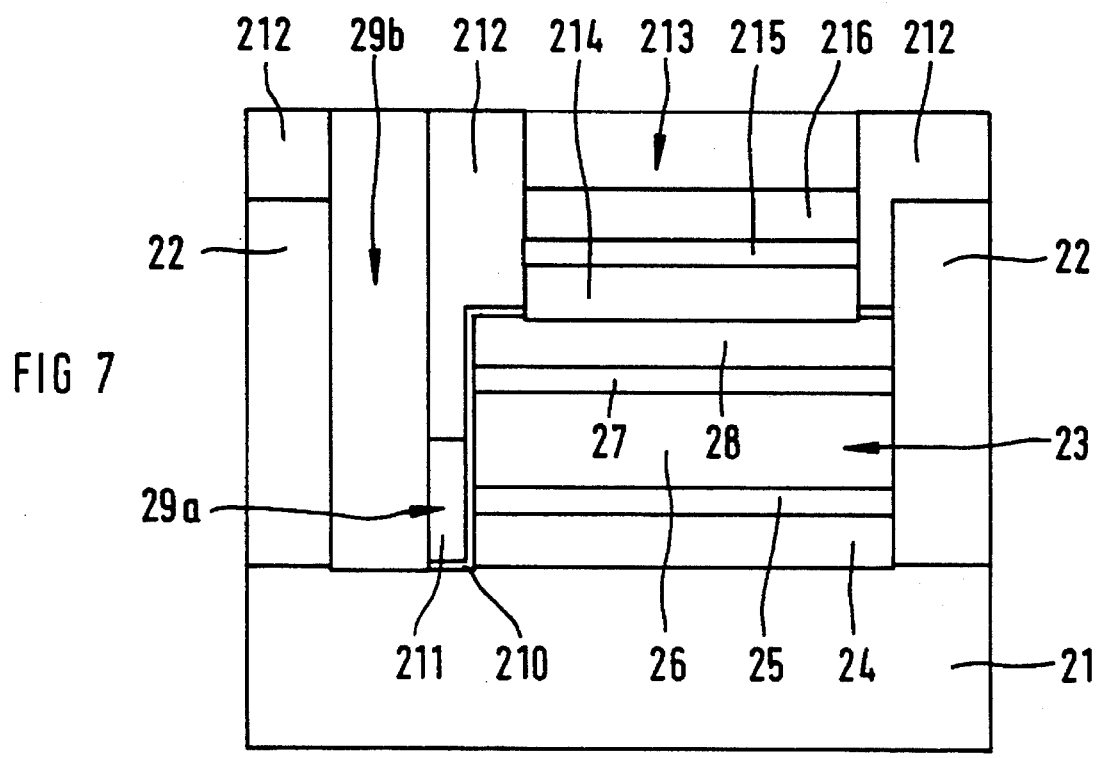
Figure 8:
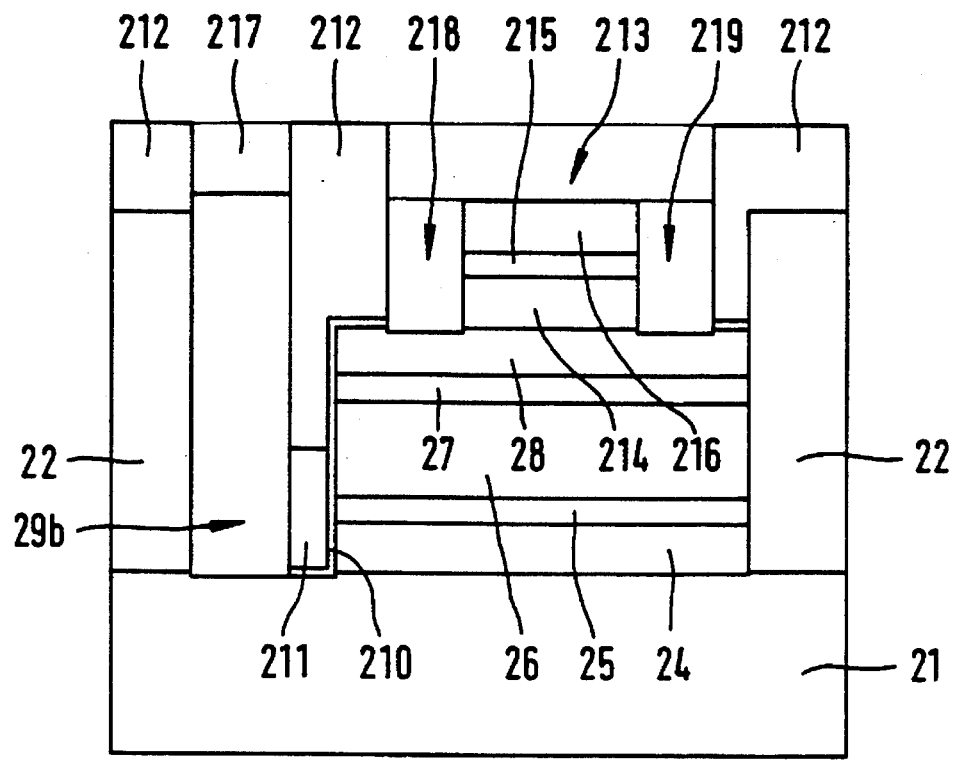

A second part 29b of the first opening 29 is produced such that it partially overlaps the first part 29a of the first opening 29 and such that it extends at least up to the neighboring sidewall of the first hole 23 (see FIG. 7). To that end, an anisotropic etching process is implemented photolithographically. The surface of the substrate 21 is uncovered within the second part 29b of the first opening 29.

The second part 29b of the first opening 29 is filled with a filler 217 of $n^+$-doped polysilicon. By re-etching the $n^+$-doped polysilicon, the surface of the eighth layer 216 is uncovered.

A second opening 219 and a third opening 218 are produced along sidewalls of the second hole 213 that lie opposite one another. To that end, an anisotropic etching process that stops on the surface of the $n^+$-doped, fifth layer 25 is first implemented with a phototechnique in the region of the second opening 219 and the region of the third opening 218. Subsequently, the etching is continued (with a further photolithographic mask) in the region of the third opening 218 and in the region of the second opening 219 until the surface of the third layer 26 is exposed (see FIG. 9).

A second dielectric layer 220 is produced by thermal oxidation in the temperature range between 700° and 800° C. Due to the different dopant concentrations in the sixth layer 214, the eighth layer 216, in the fifth layer 28 and the third layer 26, and in the fourth layer 27 and the seventh layer 217, the second dielectric layer 220 thereby grows with a thickness greater by a factor of five at the respective surfaces of the third layer 26, the fifth layer 28, the sixth layer 214 and the eighth layer 216 than it does on the respective surfaces of the fourth layer 27 and the seventh layer 215. The second dielectric layer 220 acts as a gate dielectric on the surfaces of the fourth layer 27 and the seventh layer 215. Due to its greater thickness, by contrast, the second dielectric layer 220 acts as an insulation structure on the surfaces of the eighth layer 216, the sixth layer 214, the fifth layer 28 and the third layer 26.

Subsequently, the second opening 218 and the third opening 219 are respectively filled with a further filler 221 of, for example, n⁺-doped polysilicon. The surface of the second dielectric layer 220, which is arranged parallel to the surface of the substrate 21 on the eighth layer 216, remains free.

Figure 9:
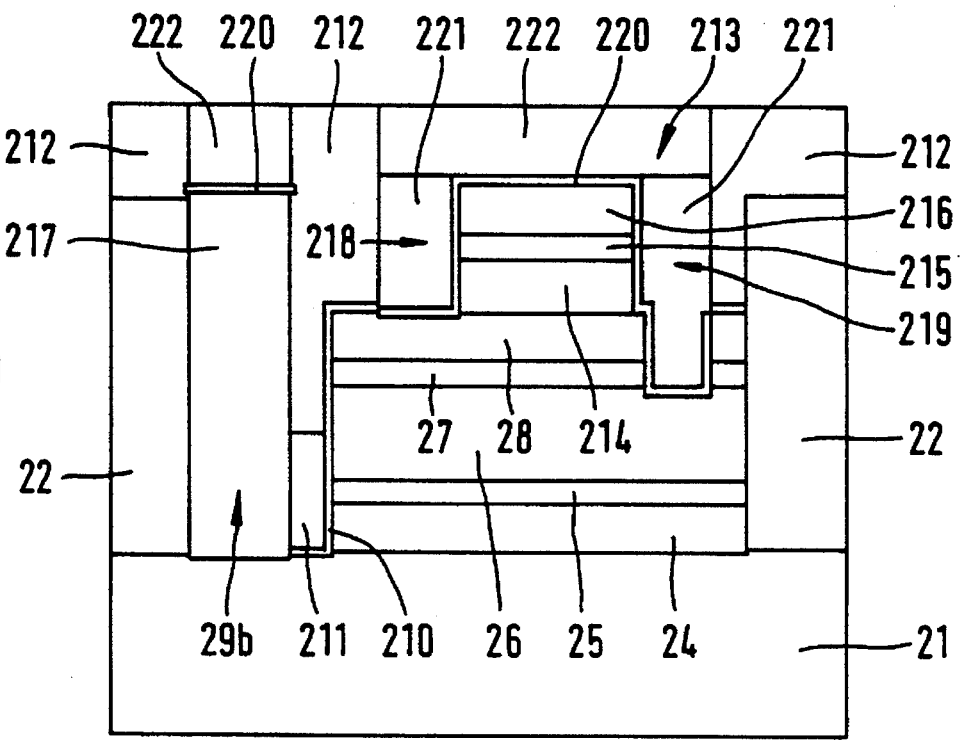

Subsequently, the remaining volumes in the second part 29b of the first opening and in the second hole 213 are filled by deposition of a third insulating layer 222 of, for example, $SiO_2$ (see FIG. 9).

Figure 10:
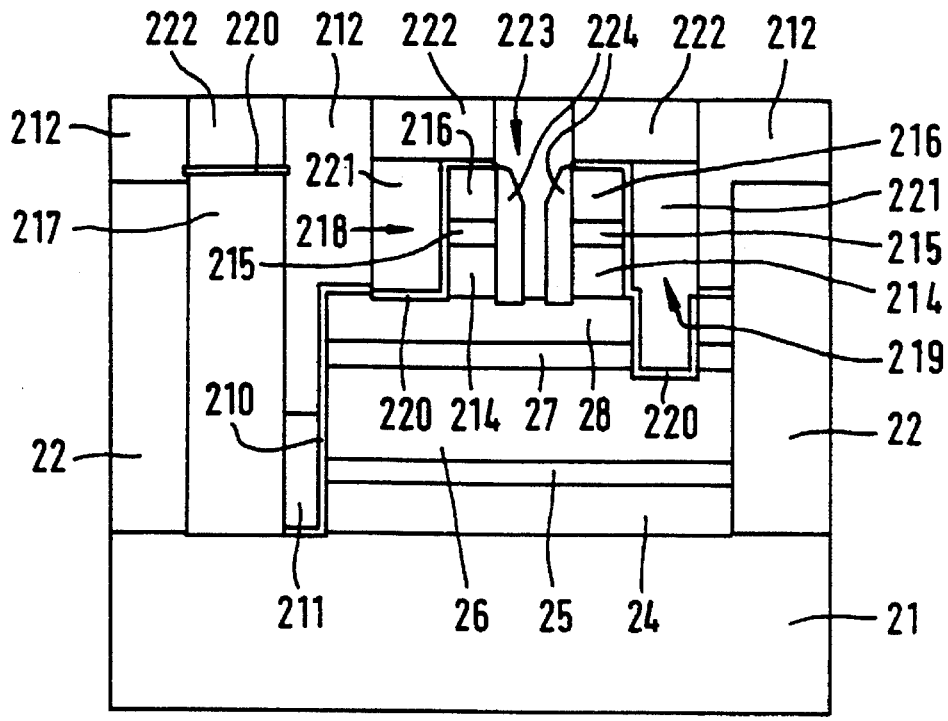

The fourth opening 223, which extends onto the surface of the fifth layer 28, is produced between the second opening 218 and the third opening 219 using a further photolithographic mask in an anisotropic etching step. The etching process employs stops, for example, on n⁺-doped silicon (see FIG. 10). Insulating spacers 224 of, for example, $SiO_2$ are produced at the sidewalls of the fourth opening 223 at which the respective surfaces of the sixth layer 214, the seventh layer 215 and the eighth layer 216 are uncovered.

Figure 11:
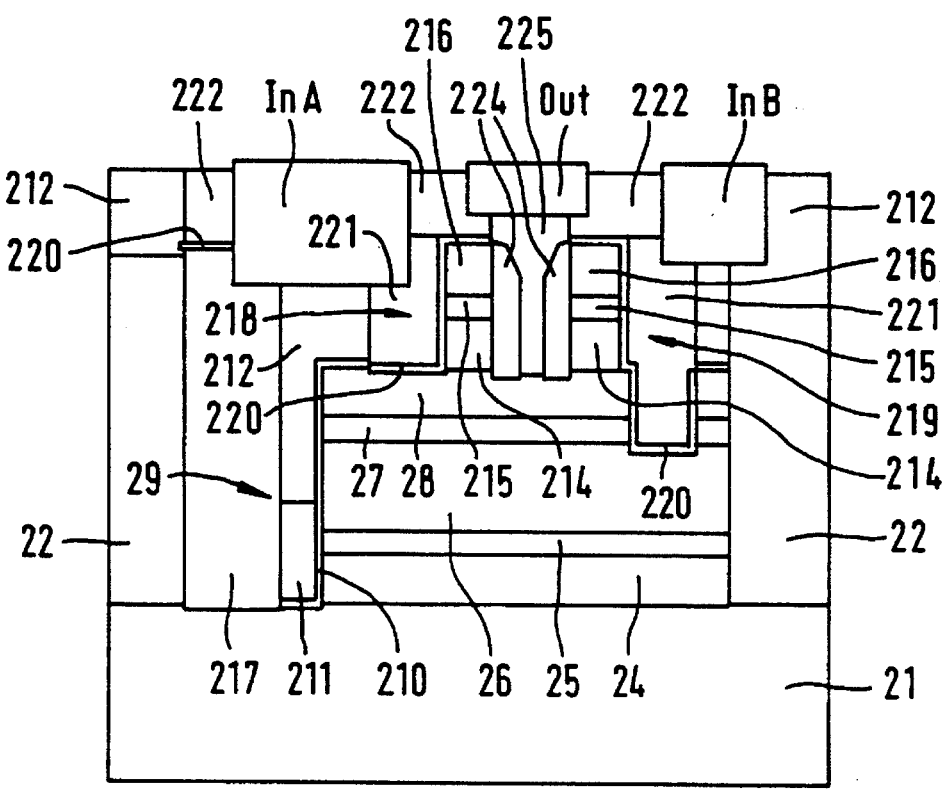

The volume remaining in the fourth opening 223 is subsequently filled with a fourth conductive structure 225 of, for example n⁺-doped polysilicon (see FIG. 11). Finally, terminals for the NAND-CMOS gate are produced. To that end, via holes are opened and are filled with contacts InA, InB as well as Out. The contacts are composed, for example, of aluminum. The contact InA extends onto the filler 217 of n⁺-doped polysilicon in the first opening 29 as well as onto the part of the further filler 221 of n⁺-doped polysilicon in the third opening 218. The filler 217 and the n⁺-doped polysilicon 211 within the first opening 29 form a first conductive structure that functions as the gate electrode for an n-channel transistor formed by the first layer 24, the second layer 25 and the third layer 26 and the first dielectric layer 210. The further filler 221 in the third opening 218 forms a third conductive structure for a p-channel transistors formed by the sixth layer 214, the seventh layer 215 and the eighth layer 216 as well as the second dielectric layer 220. The first conductive structure and the third conductive structure are thus connected to one another via the contact InA. The contact InA represents a first input of the CMOS-NAND gate.

The contact InB extends onto the part of the further filler 221 that is arranged in the second opening 219. This part of the further filler 221 arranged in the second opening 219 forms a second conductive structure that represents a gate electrode for a second n-channel transistor that is formed by the third layer 26, the fourth layer 27, the fifth layer 28 and the second dielectric layer 220, as well as for a second p-channel transistor that is formed by the sixth layer 214, the seventh layer 215, the eighth layer 216 as well as the second dielectric layer 220. The contact Out forms the output of the CMOS-NAND gate, and connects the fifth layer 28 via the fourth conductive structure 225.

Outside of the illustrated plane of section, the eighth layer 216 as well as the first layer 214 are each provided with a contact via which a first supply voltage Vss can be applied to the first layer 24 and via which a second supply voltage Vdd can be applied to the eighth layer 216.

Although modifications and changes may be suggested by those skilled in the art, it is the intention of the inventors to embody within the patent warranted hereon all changes and modifications as reasonably and properly come within the scope of their contribution to the art.

We claim as our invention:

1. An integrated circuit structure having at least one CMOS-NAND gate, said integrated circuit structure comprising:

a first MOS transistor and a second MOS transistor connected in series with a first complementary MOS transistor and a second complementary MOS transistor that are connected in parallel with one another;

each of said transistors having a vertical layer sequence forming a source, a channel having a channel length and a drain for that transistor and each layer sequence for each transistor having a sidewall at which a gate dielectric and a gate electrode are disposed;

the respective vertical layer sequences of the first and second complementary MOS transistors connected in parallel being a single, common layer sequence forming the source, channel and drain for both first and second complementary MOS transistors; and the respective layer sequences that form the series-connected first and second transistors, and said common layer sequence, being disposed above one another and said first and second transistors having respective channel lengths which are substantially equal.

2. An integrated circuit structure as claimed in claim 1, further comprising:

a substrate on which an overall layer sequence, which includes the respective layer sequences for each of said transistors, is disposed;

said overall layer sequence including a first layer, on said substrate, of a semiconductor material doped with a first conductivity type, a second layer on said first layer of a semiconductor material doped with a second conductivity type opposite said first conductivity type, a third layer on said second layer of semiconductor material doped with said first conductivity type, a fourth layer on said third layer of semiconductor material doped with said second conductivity type, a fifth layer on said fourth layer of semiconductor material doped with said first conductivity type, a sixth layer on said fifth layer of semiconductor material doped with said second conductivity type, a seventh layer on said sixth layer of semiconductor material doped with said first conductivity type, and an eighth layer on said seventh layer of semiconductor material doped with said second conductivity type;

said overall layer sequence having a first opening extending at least to the first layer, said first opening having a surface adjoining the second layer at which a gate dielectric is disposed, and having surfaces adjoining the first and third layers and said substrate at which a first insulation structure is disposed, and a first conductive structure disposed in said first opening;

said overall layer sequence having a second opening extending onto the third layer, said second opening having a surface adjoining the fourth layer and the seventh layer at which a second gate dielectric is disposed, and surfaces adjoining the third, fifth, sixth, seventh and eighth layers at which a second insulation structure is disposed, and a second conductive structure disposed in said second opening;

said overall layer sequence having a third opening extending into the sixth layer, said third opening having a surface adjoining the seventh layer at which a third gate dielectric is disposed, and having surfaces adjoining the fifth, sixth and eight layers at which a third insulation structure is disposed, and a third conductive structure disposed in said third opening;

said overall layer sequence having a fourth opening extending at least onto the fifth layer and a fourth conductive structure disposed in said fourth opening, said fourth conductive structure contacting the fifth layer and being insulated from the sixth, seventh and eighth layers;

a plurality of electrical contacts respectively connected to the first layer, the eighth layer, the first conductive structure, the second conductive structure, the third conductive structure and the fourth conductive structure; and the contacts to the first conductive structure and to the third conductive structure being connected to one another.

3. An integrated circuit as claimed in claim 2, wherein the first conductive structure, the second conductive structure, the third conductive structure and the fourth conductive structure respectively substantially fill the first opening, the second opening, the third opening and the fourth opening.

4. An integrated circuit as claimed in claim 2, further comprising an insulating layer disposed on said substrate and having a hole therein, and wherein the overall layer sequence is disposed said hole in said insulating layer with at least the second layer, the third layer, the fourth layer, the fifth layer, the sixth layer, the seventh layer and the eighth layer annularly surrounded by the insulating layer.

5. An integrated circuit as claimed in claim 4, wherein a portion of the first layer is disposed under the insulating layer outside of said hole in said insulating layer and;

wherein said insulating layer has a fifth opening extending at least onto said portion of the first layer and said fifth opening having a fifth conductive structure disposed therein, said fifth conductive structure contacting the first layer and being insulated from the substrate.

* * * * *